US012154812B2

(12) United States Patent
Momiyama et al.

(10) Patent No.: US 12,154,812 B2
(45) Date of Patent: Nov. 26, 2024

(54) ELECTROSTATIC CHUCK

(71) Applicant: TOTO LTD., Kitakyushu (JP)

(72) Inventors: Yutaka Momiyama, Kitakyushu (JP); Hitoshi Sasaki, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 72 days.

(21) Appl. No.: 16/829,738

(22) Filed: Mar. 25, 2020

(65) Prior Publication Data
US 2020/0312694 A1 Oct. 1, 2020

(30) Foreign Application Priority Data

Mar. 28, 2019 (JP) ................................. 2019-062369
Mar. 28, 2019 (JP) ................................. 2019-062370

(Continued)

(51) Int. Cl.
H01L 21/683 (2006.01)
B32B 7/12 (2006.01)
(Continued)

(52) U.S. Cl.
CPC ............ *H01L 21/6833* (2013.01); *B32B 7/12* (2013.01); *B32B 9/005* (2013.01); *B32B 9/041* (2013.01);
(Continued)

(58) Field of Classification Search
CPC ..... Y10T 428/31678; Y10T 428/31692; Y10T 428/31699; Y10T 428/31663;
(Continued)

(56) References Cited

U.S. PATENT DOCUMENTS

2003/0082925 A1 5/2003 Yano et al.
2003/0178638 A1 9/2003 Fujii
(Continued)

FOREIGN PATENT DOCUMENTS

JP H04-287344 A 10/1992
JP 2000-169714 A 6/2000
(Continued)

OTHER PUBLICATIONS

Machine translation (Google Patents) of KR 10-0587191 B1. Translated Apr. 7, 2023. (Year: 2023).*
(Continued)

*Primary Examiner* — Maria V Ewald
*Assistant Examiner* — Ethan A. Utt
(74) *Attorney, Agent, or Firm* — Carrier, Shende & Associates; Joseph P. Carrier; Fulchand P. Shende

(57) ABSTRACT

According to one embodiment, an electrostatic chuck includes a ceramic dielectric substrate, a base plate, and a bonding layer provided between the ceramic dielectric substrate and the base plate. At least one of the following first to sixth conditions is satisfied: First condition: An elongation percentage $\alpha 1$ is not less than 120%; Second condition: A ratio $\alpha 1/\alpha 2$ of the elongation percentage is not less than 0.60; Third condition: A bonding strength $\beta 1$ is not less than 0.4 MPa and not more than 10 MPa; Fourth condition: A ratio $\beta 1/\beta 2$ of the bonding strength is not less than 0.6 and not more than 10; Fifth condition: An elastic modulus $\gamma 1$ is not less than 0.1 MPa and not more than 10 MPa; Sixth condition: A ratio $\gamma 1/\gamma 2$ of the elastic modulus is not less than 0.6 and not more than 30.

20 Claims, 9 Drawing Sheets

(30) Foreign Application Priority Data

Mar. 28, 2019 (JP) ................................ 2019-062371
Mar. 28, 2019 (JP) ................................ 2019-062372

(51) Int. Cl.
| | |
|---|---|
| *B32B 9/00* | (2006.01) |
| *B32B 9/04* | (2006.01) |
| *B32B 15/04* | (2006.01) |
| *B32B 15/08* | (2006.01) |
| *C23C 14/06* | (2006.01) |
| *C23C 14/08* | (2006.01) |

(52) U.S. Cl.
CPC .............. *B32B 9/045* (2013.01); *B32B 15/04* (2013.01); *B32B 15/08* (2013.01); *C23C 14/0635* (2013.01); *C23C 14/0641* (2013.01); *C23C 14/08* (2013.01); *B32B 2307/54* (2013.01); *B32B 2307/542* (2013.01)

(58) Field of Classification Search
CPC ..... Y10T 428/31855; Y10T 428/31935; Y10T 428/31511; Y10T 428/31515; Y10T 428/31518; Y10T 428/31522; Y10T 428/31525; Y10T 428/31529; Y10T 428/31645; Y10T 428/31649; B32B 7/00; B32B 7/02; B32B 7/022; B32B 7/04; B32B 7/12; B32B 15/00; B32B 15/04; B32B 15/08; B32B 15/082; B32B 15/092; B32B 15/20; B32B 18/00; B32B 27/00; B32B 27/04; B32B 27/06; B32B 27/28; B32B 27/283; B32B 27/30; B32B 27/308; B32B 27/38; B32B 2307/50; B32B 2307/51; H01L 21/00; H01L 21/67; H01L 21/683; H01L 21/6831; H01L 21/6833; H01L 21/687; H01L 21/68714; H01L 21/68757; H01L 21/68785; C09J 7/00; C09J 7/10; C09J 7/20; C09J 7/28; C09J 7/30; C09J 7/38; C09J 7/381; C09J 7/385; C09J 9/00; C09J 133/00; C09J 133/04; C09J 133/08; C09J 133/10; C09J 133/12; C09J 163/00; C09J 183/00; C09J 183/04; C09J 183/06; C09J 183/08; C09J 11/00; C09J 11/02; C09J 11/04; C09J 2301/30; C09J 2301/302; C09J 2301/312; C09J 2301/40; C09J 2301/408; C09J 2400/00; C09J 2400/10; C09J 2400/12; C09J 2400/123; C09J 2400/126; C09J 2400/16; C09J 2400/163; C09J 2400/166
USPC .... 428/457, 461, 463, 469, 472, 472.2, 446, 428/447, 448, 450, 500, 522, 413–418, 428/26, 428, 429, 432, 433, 441, 442, 428/688, 689, 698, 702, 343, 344, 354, 428/355 R, 355 EP, 355 EN, 355 AC
See application file for complete search history.

(56) References Cited

U.S. PATENT DOCUMENTS

| | | | |
|---|---|---|---|
| 2009/0305489 A1* | 12/2009 | Fish ................... | H01L 21/6831 257/E21.334 |
| 2014/0355169 A1 | 12/2014 | Maeta et al. | |
| 2015/0279714 A1* | 10/2015 | Yamaguchi ......... | H01L 21/6831 279/128 |
| 2016/0196999 A1 | 7/2016 | Yanoh et al. | |
| 2016/0240422 A1* | 8/2016 | Takahashi ........... | H01L 21/6831 |
| 2017/0229335 A1* | 8/2017 | Ito ....................... | H01L 21/6833 |
| 2017/0278738 A1 | 9/2017 | Ito et al. | |
| 2018/0108555 A1* | 4/2018 | Kosakai ............. | H01L 21/6833 |

FOREIGN PATENT DOCUMENTS

| | | | | | |
|---|---|---|---|---|---|
| JP | 2003-273202 | A | | 9/2003 | |
| JP | 2010-040644 | A | | 2/2010 | |
| JP | 2012-142413 | A | | 7/2012 | |
| JP | 2012248693 | A | * | 12/2012 | |
| JP | 2015103550 | A | * | 6/2015 | |
| JP | 2017-059771 | A | | 3/2017 | |
| JP | 2017-174987 | A | | 9/2017 | |
| JP | 2020-023088 | A | | 2/2020 | |
| KR | 100587191 | B1 | * | 6/2006 | |
| WO | 01/66645 | A1 | | 9/2001 | |
| WO | 2016/035878 | A1 | | 3/2016 | |
| WO | WO-2016158110 | A1 | * | 10/2016 | ......... H01L 21/6831 |

OTHER PUBLICATIONS

Machine translation (Espacenet) of JP 2012-248693 A. Translated Aug. 11, 2023. (Year: 2023).*
Machine translation (Espacenet) of JP 2015-103550 A. Translated Aug. 9, 2024. (Year: 2024).*
J. Watanabe, "Recent millable type silicone rubber", Nippon Gomu Kyokaishi, 1989 vol. 62 issue 12, pp. 767-777.

* cited by examiner

| | MEASUREMENT TEMPERATURE (°C) | ELONGATION PERCENTAGE α (%) | ELONGATION PERCENTAGE α RATIO | BONDING STRENGTH β (MPa) | BONDING STRENGTH β RATIO | ELASTIC MODULUS γ (MPa) | ELASTIC MODULUS γ RATIO | BONDING LAYER PEELING | DIELECTRIC SUBSTRATE BREAKAGE |
|---|---|---|---|---|---|---|---|---|---|
| EXAMPLE 1 | 25 | 190 (α2) | 1.2 (α1/α2) | 0.83 (β2) | 1.7 (β1/β2) | 0.44 (γ2) | 1.4 (γ1/γ2) | NO | NO |
| | -60 | 225 (α1) | | 1.42 (β1) | | 0.63 (γ1) | | NO | NO |
| REFERENCE EXAMPLE 1 | 25 | 195 (α2) | 0.5 (α1/α2) | 0.56 (β2) | 53.2 (β1/β2) | 0.29 (γ2) | 96.6 (γ1/γ2) | NO | NO |
| | -60 | 107 (α1) | | 29.8 (β1) | | 28 (γ1) | | YES | YES |

FIG. 7

|  | MEASUREMENT TEMPERATURE (°C) | ELONGATION PERCENTAGE α (%) | ELONGATION PERCENTAGE α RATIO | BONDING STRENGTH β (MPa) | BONDING STRENGTH β RATIO | ELASTIC MODULUS γ (MPa) | ELASTIC MODULUS γ RATIO | BONDING LAYER PEELING | DIELECTRIC SUBSTRATE BREAKAGE |
|---|---|---|---|---|---|---|---|---|---|
| EXAMPLE 2 | 25 | 270 (α2) | 0.90 (α1/α2) | 0.51 (β2) | 1.9 (β1/β2) | 0.19 (γ2) | 2.1 (γ1/γ2) | NO | NO |
|  | -60 | 244 (α1) |  | 0.95 (β1) |  | 0.39 (γ1) |  | NO | NO |
| EXAMPLE 3 | 25 | 200 (α2) | 0.88 (α1/α2) | 0.95 (β2) | 0.8 (β1/β2) | 0.48 (γ2) | 0.9 (γ1/γ2) | NO | NO |
|  | -60 | 175 (α1) |  | 0.75 (β1) |  | 0.43 (γ1) |  | NO | NO |
| EXAMPLE 4 | 25 | 150 (α2) | 1.17 (α1/α2) | 0.85 (β2) | 1.5 (β1/β2) | 0.57 (γ2) | 1.3 (γ1/γ2) | NO | NO |
|  | -60 | 175 (α1) |  | 1.25 (β1) |  | 0.71 (γ1) |  | NO | NO |
| EXAMPLE 5 | 25 | 175 (α2) | 1.00 (α1/α2) | 0.70 (β2) | 1.0 (β1/β2) | 0.40 (γ2) | 1.0 (γ1/γ2) | NO | NO |
|  | -60 | 175 (α1) |  | 0.70 (β1) |  | 0.40 (γ1) |  | NO | NO |
| EXAMPLE 6 | 25 | 250 (α2) | 0.88 (α1/α2) | 0.80 (β2) | 1.8 (β1/β2) | 0.32 (γ2) | 2.0 (γ1/γ2) | NO | NO |
|  | -60 | 220 (α1) |  | 1.40 (β1) |  | 0.64 (γ1) |  | NO | NO |
| EXAMPLE 7 | 25 | 197 (α2) | 0.96 (α1/α2) | 1.30 (β2) | 1.5 (β1/β2) | 0.66 (γ2) | 1.5 (γ1/γ2) | NO | NO |
|  | -60 | 190 (α1) |  | 1.90 (β1) |  | 1.00 (γ1) |  | NO | NO |
| EXAMPLE 8 | 25 | 223 (α2) | 0.85 (α1/α2) | 1.10 (β2) | 1.7 (β1/β2) | 0.49 (γ2) | 2.0 (γ1/γ2) | NO | NO |
|  | -60 | 190 (α1) |  | 1.90 (β1) |  | 1.00 (γ1) |  | NO | NO |
| EXAMPLE 9 | 25 | 210 (α2) | 0.90 (α1/α2) | 1.30 (β2) | 1.5 (β1/β2) | 0.62 (γ2) | 1.6 (γ1/γ2) | NO | NO |
|  | -60 | 190 (α1) |  | 1.90 (β1) |  | 1.00 (γ1) |  | NO | NO |
| EXAMPLE 10 | 25 | 197 (α2) | 0.94 (α1/α2) | 1.60 (β2) | 1.2 (β1/β2) | 0.81 (γ2) | 1.3 (γ1/γ2) | NO | NO |
|  | -60 | 186 (α1) |  | 1.90 (β1) |  | 1.02 (γ1) |  | NO | NO |
| EXAMPLE 11 | 25 | 237 (α2) | 1.03 (α1/α2) | 0.58 (β2) | 1.6 (β1/β2) | 0.24 (γ2) | 1.6 (γ1/γ2) | NO | NO |
|  | -60 | 244 (α1) |  | 0.93 (β1) |  | 0.38 (γ1) |  | NO | NO |
| EXAMPLE 12 | 25 | 280 (α2) | 0.88 (α1/α2) | 0.72 (β2) | 1.3 (β1/β2) | 0.26 (γ2) | 1.5 (γ1/γ2) | NO | NO |
|  | -60 | 247 (α1) |  | 0.94 (β1) |  | 0.38 (γ1) |  | NO | NO |
| EXAMPLE 13 | 25 | 280 (α2) | 0.80 (α1/α2) | 0.72 (β2) | 1.1 (β1/β2) | 0.26 (γ2) | 1.3 (γ1/γ2) | NO | NO |
|  | -60 | 225 (α1) |  | 0.76 (β1) |  | 0.34 (γ1) |  | NO | NO |
| EXAMPLE 14 | 25 | 250 (α2) | 0.87 (α1/α2) | 0.52 (β2) | 1.7 (β1/β2) | 0.21 (γ2) | 1.9 (γ1/γ2) | NO | NO |
|  | -60 | 217 (α1) |  | 0.87 (β1) |  | 0.40 (γ1) |  | NO | NO |

ELECTROSTATIC CHUCK

CROSS-REFERENCE TO RELATED APPLICATIONS

This application is based upon and claims the benefit of priority from Japanese Patent Application No. 2019-062369, filed on Mar. 28, 2019, No. 2019-062370, filed on Mar. 28, 2019, No. 2019-062371, filed on Mar. 28, 2019, and No. 2019-062372, filed on Mar. 28, 2019; the entire contents of which are incorporated herein by reference.

FIELD

Embodiments described herein relate generally to an electrostatic chuck.

BACKGROUND

An electrostatic chuck is used to attract and hold an object to be chucked (an object) such as a semiconductor wafer, a glass substrate, or the like in a substrate processing apparatus performing etching, CVD (Chemical Vapor Deposition), sputtering, ion implantation, ashing, exposure, inspection, etc.

The electrostatic chuck is made by sandwiching an electrode between ceramic dielectric substrates of alumina or the like and by sintering. The electrostatic chuck applies electrical power for electrostatic attraction to the built-in electrode and attracts and holds a substrate such as a silicon wafer or the like by an electrostatic force.

For such a substrate processing apparatus of recent years, processing in environments at lower-than-conventional temperatures is being investigated to increase the patterning precision for process downscaling. Accordingly, it is also necessary for the electrostatic chuck to have low-temperature tolerance to be useable in environments at lower-than-conventional temperatures.

Although a conventional electrostatic chuck is usable in low-temperature environments of, for example, about −20° C., the flexibility of the bonding layer bonding the ceramic dielectric substrate and the base plate decreases in cryogenic environments of −60° C. or less; and knowledge has been obtained that there is a risk of the ceramic dielectric substrate peeling from the base plate, or the ceramic dielectric substrate may break or fracture according to, for example, the surface pattern, the configuration, the thickness, etc.

SUMMARY

According to the embodiment, an electrostatic chuck includes a ceramic dielectric substrate, a base plate, and a bonding layer. The base plate supports the ceramic dielectric substrate. The base plate is made of a metal. The bonding layer includes a resin material. The bonding layer is provided between the ceramic dielectric substrate and the base plate. At least one of the following first to sixth conditions is satisfied: First condition: An elongation percentage $\alpha 1$ of the bonding layer at −60° C. is not less than 120%; Second condition: A ratio $\alpha 1/\alpha 2$ of the elongation percentage $\alpha 1$ to an elongation percentage $\alpha 2$ of the bonding layer at 25° C. is not less than 0.6; Third condition: A bonding strength $\beta 1$ of the bonding layer at −60° C. is not less than 0.4 MPa and not more than 10 MPa; Fourth condition: A ratio $\beta 1/\beta 2$ of the bonding strength $\beta 1$ to a bonding strength $\beta 2$ of the bonding layer at 25° C. is not less than 0.6 and not more than 10; Fifth condition: An elastic modulus $\gamma 1$ of the bonding layer at −60° C. is not less than 0.1 MPa and not more than 10 MPa; Sixth condition: A ratio $\gamma 1/\gamma 2$ of the elastic modulus $\gamma 1$ to an elastic modulus $\gamma 2$ of the bonding layer at 25° C. is not less than 0.6 and not more than 30.

BRIEF DESCRIPTION OF THE DRAWINGS

FIG. 7 is a table illustrating the properties of the example of the bonding layer of the electrostatic chuck according to the embodiment;

FIG. 8 is a table illustrating properties of an example of the bonding layer of the electrostatic chuck according to the embodiment.

DETAILED DESCRIPTION

Figure 1:
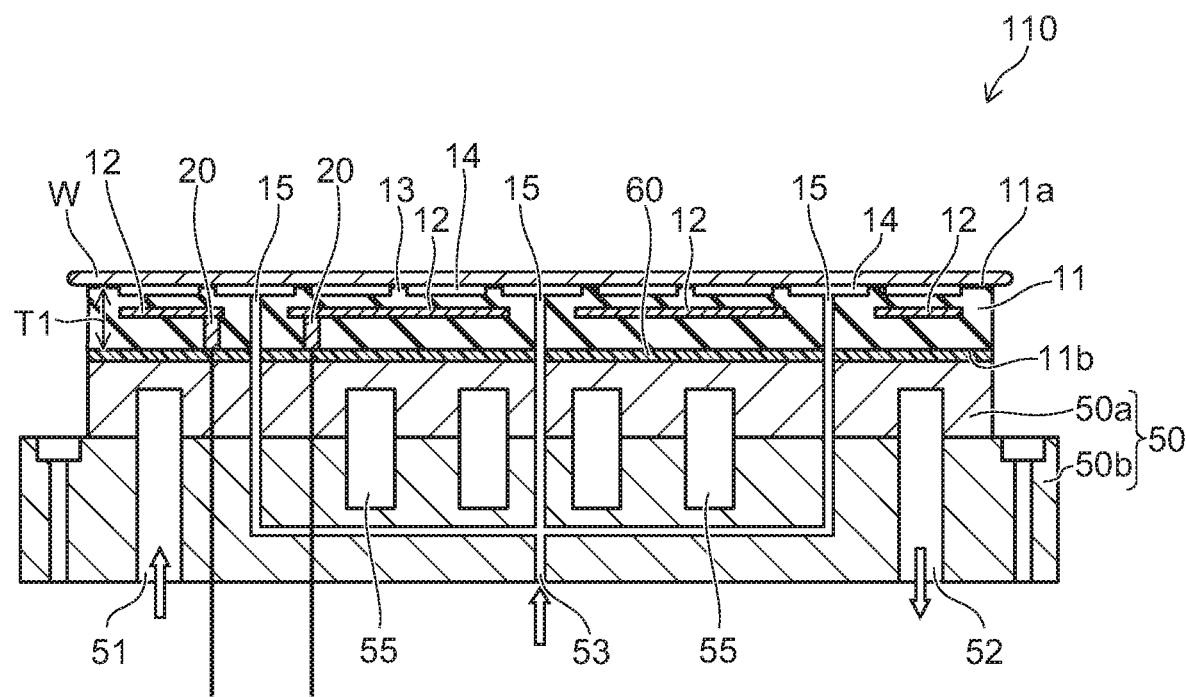
FIG. 1 is a schematic cross-sectional view illustrating an electrostatic chuck according to an embodiment.

A first invention is an electrostatic chuck including a ceramic dielectric substrate, a base plate which is made of a metal and supports the ceramic dielectric substrate, and a bonding layer which includes a resin material and is provided between the ceramic dielectric substrate and the base plate; and at least one of the following first to sixth conditions are satisfied. First condition: An elongation percentage $\alpha 1$ of the bonding layer at −60° C. is 120% or more. Second condition: A ratio $\alpha 1/\alpha 2$ of the elongation percentage $\alpha 1$ to an elongation percentage $\alpha 2$ of the bonding layer at 25° C. is 0.60 or more. Third condition: A bonding strength $\beta 1$ of the bonding layer at −60° C. is not less than 0.4 MPa and not more than 10 MPa. Fourth condition: A ratio $\beta 1/\beta 2$ of the bonding strength $\beta 1$ to a bonding strength $\beta 2$ of the bonding layer at 25° C. is not less than 0.6 and not more than 10. Fifth condition: An elastic modulus $\gamma 1$ of the bonding layer at −60° C. is not less than 0.1 MPa and not more than 10 MPa. Sixth condition: A ratio $\gamma 1/\gamma 2$ of the elastic modulus $\gamma 1$ to an elastic modulus $\gamma 2$ of the bonding layer at 25° C. is not less than 0.6 and not more than 30.

According to the electrostatic chuck, when the first condition is satisfied, sufficient flexibility of the bonding layer can be ensured because the bonding layer has a sufficient elongation percentage in a cryogenic environment of −60° C. or less. The stress that is applied to the ceramic dielectric substrate in the cryogenic environment can be suppressed thereby; and the ceramic dielectric substrate breakage and the peeling from the base plate of the ceramic dielectric substrate can be suppressed.

Also, according to the electrostatic chuck, when the second condition is satisfied, the thermal expansion coefficient difference between the ceramic dielectric substrate and the base plate in environments from room temperature to cryogenic environments of −60° C. or less can be relaxed. The ceramic dielectric substrate breakage and the peeling from the base plate of the ceramic dielectric substrate can be suppressed thereby.

According to the electrostatic chuck, when the third condition is satisfied, the anchor effect of the bonding layer positioned between the ceramic dielectric substrate and the base plate in a cryogenic environment of −60° C. or less is not too weak. Thereby, in the cryogenic environment, the ceramic dielectric substrate and the base plate can be bonded more reliably. According to the electrostatic chuck, in a cryogenic environment of −60° C. or less, the anchor effect of the bonding layer positioned between the ceramic dielectric substrate and the base plate is not too strong. The stress that is applied to the ceramic dielectric substrate in the cryogenic environment can be suppressed thereby; and the ceramic dielectric substrate breakage and the peeling from the base plate of the ceramic dielectric substrate can be suppressed.

According to the electrostatic chuck, when the fourth condition is satisfied, a sufficient bonding strength of the bonding layer positioned between the ceramic dielectric substrate and the base plate can be maintained even at room temperature or in a cryogenic environment at −60° C. or less; and a strong bond between the ceramic dielectric substrate and the base plate can be maintained. According to the electrostatic chuck, even at room temperature or in a cryogenic environment at −60° C. or less, the effect of the bonding layer positioned between the ceramic dielectric substrate and the base plate can be suppressed sufficiently. The stress that is applied to the ceramic dielectric substrate in environments from room temperature to cryogenic can be suppressed thereby; and the ceramic dielectric substrate breakage and the peeling from the base plate of the ceramic dielectric substrate can be suppressed.

According to the electrostatic chuck, when the fifth condition is satisfied, the bonding layer has sufficient restorability in a cryogenic environment of −60° C. or less; therefore, even when stress is generated between the ceramic dielectric substrate and the base plate, the warp of the ceramic dielectric substrate is suppressed easily. The degradation of the in-plane temperature uniformity of the object in the cryogenic environment can be suppressed thereby. According to the electrostatic chuck, the bonding layer can be suppressed from being excessively hard in a cryogenic environment of −60° C. or less. The stress that is applied to the ceramic dielectric substrate in the cryogenic environment can be suppressed thereby; and the ceramic dielectric substrate breakage and the peeling from the base plate of the ceramic dielectric substrate can be suppressed.

According to the electrostatic chuck, when the sixth condition is satisfied, sufficient restorability of the bonding layer is maintained even at room temperature or in a cryogenic environment of −60° C. or less; therefore, even when stress is generated between the ceramic dielectric substrate and the base plate, the warp of the ceramic dielectric substrate is suppressed easily. The degradation of the in-plane temperature uniformity of the object in environments from room temperature to cryogenic can be suppressed thereby. According to the electrostatic chuck, the bonding layer can be suppressed from being excessively hard even at room temperature or in a cryogenic environment of −60° C. or less. The stress that is applied to the ceramic dielectric substrate in environments from room temperature to cryogenic can be suppressed thereby; and the ceramic dielectric substrate breakage and the peeling from the base plate of the ceramic dielectric substrate can be suppressed.

A second invention is the electrostatic chuck of the first invention, wherein the elongation percentage $\alpha 1$ is 175% or more.

According to the electrostatic chuck, the flexibility of the bonding layer can be improved further because the bonding layer has an even larger elongation percentage. The stress that is applied to the ceramic dielectric substrate in the cryogenic environment can be suppressed further thereby; and the ceramic dielectric substrate breakage and the peeling from the base plate of the ceramic dielectric substrate can be suppressed further.

A third invention is the electrostatic chuck of the second invention, wherein the elongation percentage $\alpha 1$ is 200% or more.

According to the electrostatic chuck, the flexibility of the bonding layer can be improved further because the bonding layer has an even larger elongation percentage. The stress that is applied to the ceramic dielectric substrate in the cryogenic environment can be suppressed further thereby; and the ceramic dielectric substrate breakage and the peeling from the base plate of the ceramic dielectric substrate can be suppressed further.

A fourth invention is the electrostatic chuck of any one of the first to third inventions, wherein the ratio $\alpha 1/\alpha 2$ is 0.80 or more.

According to the electrostatic chuck, the thermal expansion coefficient difference between the ceramic dielectric substrate and the base plate in environments from room temperature to cryogenic environments of −60° C. or less can be relaxed further. The ceramic dielectric substrate breakage and the peeling from the base plate of the ceramic dielectric substrate can be suppressed further thereby.

A fifth invention is the electrostatic chuck of any one of the first to fourth inventions, wherein the bonding strength $\beta 1$ is not less than 0.4 MPa and not more than 2.0 MPa.

According to the electrostatic chuck, the anchor effect of the bonding layer positioned between the ceramic dielectric substrate and the base plate in a cryogenic environment of −60° C. or less can be better prevented from being too weak. Thereby, in the cryogenic environment, the ceramic dielectric substrate and the base plate can be bonded more reliably. According to the electrostatic chuck, in a cryogenic environment of −60° C. or less, the anchor effect of the bonding layer positioned between the ceramic dielectric substrate and the base plate can be better prevented from being too strong. The stress that is applied to the ceramic dielectric substrate in the cryogenic environment can be suppressed further thereby; and the ceramic dielectric substrate breakage and the peeling from the base plate of the ceramic dielectric substrate can be suppressed further.

A sixth invention is the electrostatic chuck of any one of the first to fifth inventions, wherein the ratio $\beta 1/\beta 2$ is 0.8 or more.

According to the electrostatic chuck, even at room temperature or in a cryogenic environment of −60° C. or less, a sufficient bonding strength of the bonding layer positioned between the ceramic dielectric substrate and the base plate can be maintained more reliably; and a strong bond between the ceramic dielectric substrate and the base plate can be maintained more reliably. According to the electrostatic chuck, even at room temperature or in a cryogenic environment of −60° C. or less, the effect of the bonding layer positioned between the ceramic dielectric substrate and the base plate can be suppressed more reliably. The stress that is applied to the ceramic dielectric substrate in environments from room temperature to cryogenic can be suppressed further thereby; and the ceramic dielectric substrate breakage and the peeling from the base plate of the ceramic dielectric substrate can be suppressed further.

A seventh invention is the electrostatic chuck of any one of the first to sixth inventions, wherein the elastic modulus γ1 is 0.3 MPa or more.

According to the electrostatic chuck, the bonding layer in a cryogenic environment of −60° C. or less has sufficient restorability; therefore, even when stress is generated between the ceramic dielectric substrate and the base plate, the warp of the ceramic dielectric substrate easily is suppressed further. The degradation of the in-plane temperature uniformity of the object in the cryogenic environment can be suppressed further thereby. According to the electrostatic chuck, the bonding layer can be better prevented from being too hard in a cryogenic environment of −60° C. or less. The stress that is applied to the ceramic dielectric substrate in the cryogenic environment can be suppressed further thereby; and the ceramic dielectric substrate breakage and the peeling from the base plate of the ceramic dielectric substrate can be suppressed further.

An eighth invention is the electrostatic chuck of any one of the first to seventh inventions, wherein the ratio γ1/γ2 is 0.8 or more.

According to the electrostatic chuck, even at room temperature or in a cryogenic environment of −60° C. or less, sufficient restorability of the bonding layer is maintained; therefore, even when stress is generated between the ceramic dielectric substrate and the base plate, the warp of the ceramic dielectric substrate easily is suppressed further. The degradation of the in-plane temperature uniformity of the object in environments from room temperature to cryogenic can be suppressed further thereby. According to the electrostatic chuck, even at room temperature or in a cryogenic environment of −60° C. or less, the bonding layer can be better prevented from being too hard. The stress that is applied to the ceramic dielectric substrate in environments from room temperature to cryogenic can be suppressed further thereby; and the ceramic dielectric substrate breakage and the peeling from the base plate of the ceramic dielectric substrate can be suppressed further.

A ninth invention is the electrostatic chuck of any one of the first to eighth inventions, wherein the ceramic dielectric substrate includes at least one of aluminum oxide, aluminum nitride, silicon carbide, silicon nitride, or yttrium oxide.

For example, by using a ceramic dielectric substrate including these ceramics in the electrostatic chuck according to the embodiment, an electrostatic chuck which has various excellent characteristics such as plasma resistance, stability of mechanical characteristics, thermal conductivity, electrical insulative properties, etc., can be provided.

A tenth invention is the electrostatic chuck of the ninth invention, wherein the ceramic dielectric substrate includes aluminum oxide.

According to the electrostatic chuck, both plasma resistance and mechanical strength can be realized by the ceramic dielectric substrate including aluminum oxide.

Embodiments of the invention will now be described with reference to the drawings. Similar components in the drawings are marked with the same reference numerals; and a detailed description is omitted as appropriate.

FIG. 1 is a schematic cross-sectional view illustrating an electrostatic chuck according to an embodiment.

As illustrated in FIG. 1, the electrostatic chuck 110 includes a ceramic dielectric substrate 11, a base plate 50, and a bonding layer 60.

The ceramic dielectric substrate 11 is, for example, a base having a flat plate configuration made of a sintered ceramic. The ceramic dielectric substrate 11 includes, for example, at least one of aluminum oxide (alumina ($Al_2O_3$)), aluminum nitride, silicon carbide, silicon nitride, or yttrium oxide (yttria ($Y_2O_3$)). For example, by using the ceramic dielectric substrate 11 including these ceramics in the electrostatic chuck 110 according to the embodiment, an electrostatic chuck which has various excellent characteristics such as plasma resistance, stability of mechanical characteristics (e.g., mechanical strength), thermal conductivity, electrical insulative properties, etc., can be provided.

It is favorable for the ceramic dielectric substrate 11 to include aluminum oxide. Both plasma resistance and mechanical strength can be realized by the ceramic dielectric substrate 11 including aluminum oxide. Also, by the ceramic dielectric substrate 11 including aluminum oxide, the transparency of the ceramic dielectric substrate 11 can be high; and the heat transfer can be promoted by increasing the infrared transmittance. Also, due to the high sinterability, for example, a dense sintered body can be formed without using a sintering aid; and the in-plane heat distribution can be maintained at a minimum.

It is favorable for the ceramic dielectric substrate 11 to be formed of high-purity aluminum oxide. For example, the concentration of aluminum oxide in the ceramic dielectric substrate 11 is not less than 90 mass percent (mass %) and not more than 100 mass %, and favorably not less than 95 mass percent (mass %) and not more than 100 mass %, and more favorably not less than 99 mass percent (mass %) and not more than 100 mass %. By using high-purity aluminum oxide, the plasma resistance of the ceramic dielectric substrate 11 can be improved. The concentration of aluminum oxide can be measured by X-ray fluorescence analysis, etc.

Figure 2A:
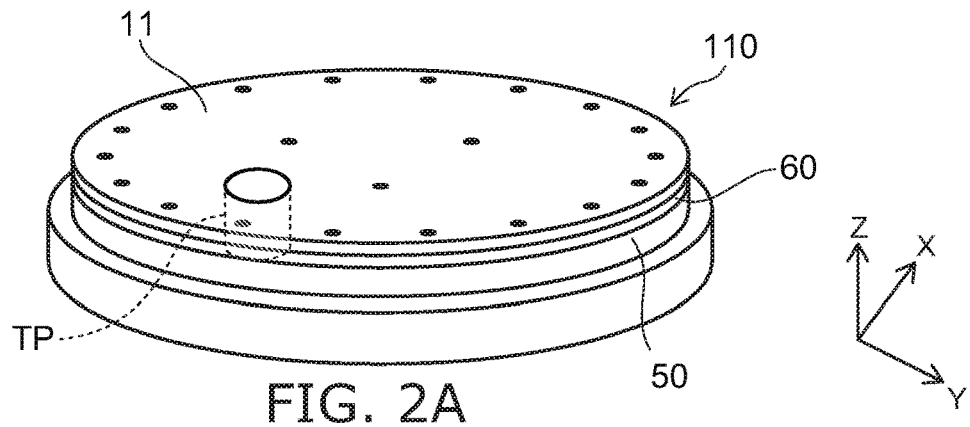
FIG. 2A to FIG. 2C are descriptive views illustrating a method for measuring the elongation percentage and the bonding strength of the bonding layer.

The ceramic dielectric substrate 11 has a first major surface 11a and a second major surface 11b. The first major surface 11a is a surface where an object W to be chucked is placed. The second major surface 11b is a surface on the side opposite to the first major surface 11a. The object W to be chucked is, for example, a semiconductor substrate such as a silicon wafer, etc. As seen in FIGS. 1 and 2A of the drawings, outer edge portions of the ceramic dielectric substrate 11 extend continuously and uninterruptedly from the upper surface (first major surface) 11a to the lower surface (second major surface) 11b thereof, such that a thickness T1 between the upper surface and the lower surface at the outer edge portions is substantially constant.

In this specification, the direction from the base plate 50 toward the ceramic dielectric substrate 11 is taken as a Z-axis direction. For example, as illustrated in the drawings, the Z-axis direction is the direction connecting the first major surface 11a and the second major surface 11b. The Z-axis direction is, for example, a direction substantially perpendicular to the first major surface 11a and the second major surface 11b. One direction orthogonal to the Z-axis direction is taken as an X-axis direction; and a direction orthogonal to the Z-axis direction and the X-axis direction is taken as a Y-axis direction. In this specification, "in the plane" is, for example, in the X-Y plane.

An electrode layer 12 is provided inside the ceramic dielectric substrate 11. The electrode layer 12 is provided between the first major surface 11a and the second major surface 11b. In other words, the electrode layer 12 is inserted into the ceramic dielectric substrate 11. For example, the electrode layer 12 may be built into the ceramic dielectric substrate 11 by sintering as a continuous body.

The electrode layer 12 is provided in a thin-film configuration along the first major surface 11a and the second major surface 11b of the ceramic dielectric substrate 11. The electrode layer 12 is a chucking electrode for attracting and holding the object W. The electrode layer 12 may be unipolar or bipolar. The electrode layer 12 illustrated in FIG. 1 is bipolar; and the two poles of the electrode layer 12 are provided in the same plane.

A connection portion 20 that extends to the second major surface 11b side of the ceramic dielectric substrate 11 is provided at the electrode layer 12. The connection portion 20 which is electrically connected to the electrode layer 12 is a via (solid), a via hole (hollow), or a metal terminal connected by an appropriate method such as brazing, etc.

The electrostatic chuck 110 attracts and holds the object W by an electrostatic force by generating a charge at the first major surface 11a side of the electrode layer 12 by applying a voltage (a chucking voltage) from a chucking power supply 505 (referring to FIG. 9) to the electrode layer 12.

A thickness T1 of the ceramic dielectric substrate 11 is, for example, 5 mm or less. The thickness T1 of the ceramic dielectric substrate 11 is the length of the ceramic dielectric substrate 11 in the Z-axis direction. In other words, the thickness T1 of the ceramic dielectric substrate 11 is the distance between the first major surface 11a and the second major surface 11b in the Z-axis direction. Thus, by setting the ceramic dielectric substrate 11 to be thin, the distance between an upper electrode 510 (referring to FIG. 9) and the base plate 50 connected to a high frequency power supply 504 (referring to FIG. 9) can be shortened.

The base plate 50 is a member supporting the ceramic dielectric substrate 11. The ceramic dielectric substrate 11 is fixed on the base plate 50 via the bonding layer 60. That is, the bonding layer 60 is provided between the ceramic dielectric substrate 11 and the base plate 50.

The bonding layer 60 includes a resin material. In the embodiment, the bonding layer 60 is configured so that the flexibility at a cryogenic temperature can be maintained. For example, the bonding layer 60 is a silicone-based, acrylic-based, modified silicone-based, or epoxy-based high polymer material and includes a high polymer material having at least one of carbon (C), hydrogen (H), nitrogen (N), silicon (Si), or oxygen (O) as a major component.

Here, in this specification, "cryogenic" refers to a low-temperature environment of −60° C. or less. Specifically, "cryogenic" refers to −60° C. to −120° C.

It is favorable for the bonding layer 60 to include silicone. By the bonding layer 60 including silicone having excellent flexibility, the flexibility of the bonding layer 60 is maintained easily in a cryogenic environment. The breakage of the ceramic dielectric substrate 11 and the peeling from the base plate 50 of the ceramic dielectric substrate 11 in a cryogenic environment can be suppressed more reliably thereby.

The bonding layer 60 may include silicone having a molecular structure in which various functional groups are bonded to a siloxane skeleton. More specifically, it is favorable for the functional group bonded to the siloxane skeleton to include, for example, at least one of a methyl group, an ethyl group, a propyl group, a butyl group, a phenyl group, or a hexyl group. By the bonding layer 60 including silicone including such a functional group, the cold resistance, the strength, the elongation percentage, etc., of the bonding layer 60 in a cryogenic environment can be increased.

It is favorable for the bonding layer 60 to further include an inorganic filler. By the bonding layer 60 further including an inorganic filler, the in-plane temperature uniformity of the object W in a cryogenic environment can be increased.

It is favorable for the inorganic filler to include at least one compound including at least one element of silicon (Si) or aluminum (Al) and at least one element of carbon (C), nitrogen (N), or oxygen (O). More specifically, it is favorable for the inorganic filler to include, for example, at least one of $Al_2O_3$, SiC, AlN, $Si_3N_4$, AlON, SIALON, or $SiO_2$. By the bonding layer 60 including such an inorganic filler, the thermal conductivity and/or stability of mechanical characteristics of the bonding layer 60 in a cryogenic environment can be increased.

For example, the base plate 50 is made of a metal such as aluminum, etc. For example, the base plate 50 is divided into an upper portion 50a and a lower portion 50b; and a passageway 55 is provided between the upper portion 50a and the lower portion 50b. One end of the passageway 55 is connected to an input channel 51; and the other end of the passageway 55 is connected to an output channel 52.

The base plate 50 also performs the role of the temperature adjustment of the electrostatic chuck 110. For example, when cooling the electrostatic chuck 110, a cooling medium such as helium gas or the like is caused to inflow through the input channel 51, pass through the passageway 55, and outflow from the output channel 52. Thereby, the heat of the base plate 50 can be absorbed by the cooling medium; and the ceramic dielectric substrate 11 which is mounted on the base plate 50 can be cooled. On the other hand, when maintaining the temperature of the electrostatic chuck 110, it is also possible to introduce a heat-retaining medium into the passageway 55. It is also possible to provide a built-in heating element in the ceramic dielectric substrate 11 and/or the base plate 50. The temperature of the object W held by the electrostatic chuck 110 can be adjusted by adjusting the temperature of the base plate 50 and/or the ceramic dielectric substrate 11.

In the example, a groove 14 is provided at the first major surface 11a side of the ceramic dielectric substrate 11. The groove 14 is recessed in the direction from the first major surface 11a toward the second major surface 11b (the Z-axis direction) and extends to be continuous in the X-Y plane. Multiple protrusions 13 (dots) are provided in at least a portion of the region of the first major surface 11a where the groove 14 is not provided. The object W is placed on the multiple protrusions 13 and is supported by the multiple protrusions 13. The protrusion 13 is a surface contacting the back surface of the object W. If the multiple protrusions 13 are provided, a space is formed between the first major surface 11a and the back surface of the object W placed on the electrostatic chuck 110. For example, the particles that are adhered to the object W can be caused to be in a favorable state by appropriately selecting the height and the number of the protrusions 13, the area ratio and the shapes of the protrusions 13, etc. For example, the height (the dimension in the Z-axis direction) of the multiple protrusions 13 can be not less than 1 μm and not more than 100 μm, favorably not less than 1 μm and not more than 30 μm, and more favorably not less than 5 μm and not more than 15 μm.

The ceramic dielectric substrate 11 has a through-hole 15 connected to the groove 14. The through-hole 15 is provided from the second major surface 11b to the first major surface 11a. In other words, the through-hole 15 extends in the Z-axis direction from the second major surface 11b to the first major surface 11a and pierces the ceramic dielectric substrate 11.

A gas introduction channel 53 is provided in the base plate 50. For example, the gas introduction channel 53 is provided to pierce the base plate 50. The gas introduction channel 53 may not pierce through the base plate 50, and may be provided to reach the ceramic dielectric substrate 11 side by branching partway into other gas introduction channels 53. The gas introduction channel 53 may be provided in multiple locations of the base plate 50.

The gas introduction channel 53 communicates with the through-hole 15. In other words, the transfer gas (helium (He) or the like) that inflows into the gas introduction channel 53 inflows into the through-hole 15 after passing through the gas introduction channel 53.

The transfer gas that inflows into the through-hole 15 inflows into the space provided between the object W and the groove 14 after passing through the through-hole 15. Thereby, the object W can be directly cooled by the transfer gas.

For example, although a conventional electrostatic chuck is usable in a low-temperature environment of about −20° C., the flexibility of the bonding layer 60 bonding the ceramic dielectric substrate 11 and the base plate 50 decreases in a cryogenic environment of about −60° C.; and there is a risk that the ceramic dielectric substrate 11 may peel from the base plate 50, and in some cases, the ceramic dielectric substrate 11 may break or fracture.

Therefore, in the embodiment, for example, the elongation percentage α is focused upon as a property relating to the flexibility of the bonding layer 60. In the following description, the elongation percentage of the bonding layer 60 at −60° C. taken as α1; and the elongation percentage of the bonding layer 60 at 25° C. is taken as α2.

In the embodiment, the elongation percentage α1 of the bonding layer 60 at −60° C. is, for example, 120% or more, and favorably 175% or more, more favorably 200% or more, more favorably 220% or more, and more favorably 240% or more.

If the elongation percentage α1 is 120% or more, the bonding layer 60 has a sufficient elongation percentage α in a cryogenic environment; therefore, sufficient flexibility of the bonding layer 60 can be ensured. Thereby, in a cryogenic environment, the stress that is applied to the ceramic dielectric substrate 11 can be suppressed; and the breakage of the ceramic dielectric substrate 11 and the peeling from the base plate 50 of the ceramic dielectric substrate 11 can be suppressed. The upper limit of the elongation percentage α1 is not particularly limited and is, for example, 1000% or less.

The elongation percentage α2 of the bonding layer 60 at 25° C. is, for example, 150% or more, favorably 200% or more, and more favorably 250% or more.

If the elongation percentage α2 is 150% or more, the bonding layer 60 has a sufficient elongation percentage α in a room-temperature environment; therefore, sufficient flexibility of the bonding layer 60 can be ensured. The stress that is applied to the ceramic dielectric substrate 11 in a room-temperature environment can be suppressed thereby; and the breakage of the ceramic dielectric substrate 11 and the peeling from the base plate 50 of the ceramic dielectric substrate 11 can be suppressed. The upper limit of the elongation percentage α2 is not particularly limited and is, for example, 1650% or less.

The ratio α1/α2 of the elongation percentage α1 to the elongation percentage α2 is, for example, 0.60 or more, and favorably 0.80 or more, and more favorably 0.90 or more.

If the ratio α1/α2 of the elongation percentage α is 0.60 or more, the thermal expansion coefficient difference between the ceramic dielectric substrate 11 and the base plate 50 in environments from room temperature to cryogenic can be relaxed. The breakage of the ceramic dielectric substrate 11 and the peeling from the base plate 50 of the ceramic dielectric substrate 11 can be suppressed thereby. The upper limit of the ratio α1/α2 of the elongation percentage α is not particularly limited and is, for example, 1.5 or less.

In the embodiment, for example, the bonding strength 13 also is focused upon as a property relating to the flexibility of the bonding layer 60. In the following description, the bonding strength of the bonding layer 60 at −60° C. is taken as β1; and the bonding strength of the bonding layer 60 at 25° C. is taken as β2.

In the embodiment, the bonding strength β1 of the bonding layer 60 at −60° C. is, for example, not less than 0.4 MPa and not more than 10 MPa, and favorably not less than 0.4 MPa and not more than 2.0 MPa, more favorable not less than 0.4 MPa and not more than 1.9 MPa, and more favorably not less than 0.4 MPa and not more than 1.4 MPa. The bonding strength β1 is favorably 0.7 MPa or more.

If the bonding strength β1 is 0.4 MPa or more, the anchor effect of the bonding layer 60 positioned between the ceramic dielectric substrate 11 and the base plate 50 in a cryogenic environment is not too weak. Thereby, the ceramic dielectric substrate 11 and the base plate 50 can be bonded more reliably in a cryogenic environment.

If the bonding strength β1 is 10 MPa or less, the anchor effect of the bonding layer 60 positioned between the ceramic dielectric substrate 11 and the base plate 50 in a cryogenic environment is not too strong. Thereby, in a cryogenic environment, the stress that is applied to the ceramic dielectric substrate 11 can be suppressed; and the breakage of the ceramic dielectric substrate 11 and the peeling from the base plate 50 of the ceramic dielectric substrate 11 can be suppressed.

The bonding strength β2 of the bonding layer 60 at 25° C. is, for example, not less than 0.5 MPa and not more than 1.5 MPa, and favorably not less than 0.5 MPa and not more than 0.8 MPa.

If the bonding strength β2 is 0.5 MPa or more, the anchor effect of the bonding layer 60 reaching the surface of the ceramic dielectric substrate 11 and the surface of the base plate 50 in a room-temperature environment is not too weak. Thereby, the ceramic dielectric substrate 11 and the base plate 50 can be bonded more reliably in a room-temperature environment.

If the bonding strength β2 is 1.5 MPa or less, the anchor effect of the bonding layer 60 bonding to the surface of the ceramic dielectric substrate 11 in a room-temperature environment is not too strong. The stress that is applied to the ceramic dielectric substrate 11 in a room-temperature environment can be suppressed thereby; and the breakage of the ceramic dielectric substrate 11 and the peeling from the base plate 50 of the ceramic dielectric substrate 11 can be suppressed.

The ratio β1/β2 of the bonding strength β1 to the bonding strength β2 is, for example, not less than 0.6 and not more than 10, favorably not less than 0.6 and not more than 5, and more favorably not less than 0.6 and not more than 3. The ratio β1/β2 is favorably 0.8 or more, and more favorably 1.1 or more. The ratio β1/β2 is favorably 1.9 or less.

If the ratio β1/β2 of the bonding strength β is 0.6 or more, a sufficient bonding strength of the bonding layer 60 positioned between the ceramic dielectric substrate 11 and the base plate 50 can be maintained even at room temperature and even in a cryogenic environment; and a strong bond between the ceramic dielectric substrate 11 and the base plate 50 can be maintained.

If the ratio $\beta1/\beta2$ of the bonding strength $\beta$ is 10 or less, the effect of the bonding layer 60 positioned between the ceramic dielectric substrate 11 and the base plate 50 even at room temperature and even in a cryogenic environment can be suppressed sufficiently. The stress that is applied to the ceramic dielectric substrate 11 in environments from room temperature to cryogenic can be suppressed thereby; and the breakage of the ceramic dielectric substrate 11 and the peeling from the base plate 50 of the ceramic dielectric substrate 11 can be suppressed.

In the embodiment, for example, the elastic modulus $\gamma$ also is focused upon as a property relating to the flexibility of the bonding layer 60. In the following description, the elastic modulus of the bonding layer 60 at $-60°$ C. is taken as $\gamma1$; and the elastic modulus of the bonding layer 60 at $25°$ C. is taken as $72$.

In the embodiment, the elastic modulus $\gamma1$ of the bonding layer 60 at $-60°$ C. is, for example, not less than 0.1 MPa and not more than 10 MPa, favorably not less than 0.1 MPa and not more than 3 MPa, and more favorably not less than 0.1 MPa and not more than 1 MPa. The elastic modulus $\gamma1$ is favorably 0.3 MPa or more, and more favorably 0.4 MPa or more.

If the elastic modulus $\gamma1$ is 0.1 MPa or more, the bonding layer 60 has sufficient restorability in a cryogenic environment; therefore, the warp of the ceramic dielectric substrate 11 is suppressed easily even when stress is generated between the ceramic dielectric substrate 11 and the base plate 50. The degradation of the in-plane temperature uniformity of the object W in a cryogenic environment can be suppressed thereby.

If the elastic modulus $\gamma1$ is 10 MPa or less, the bonding layer 60 in a cryogenic environment can be prevented from being too hard. Thereby, in a cryogenic environment, the stress that is applied to the ceramic dielectric substrate 11 can be suppressed; and the breakage of the ceramic dielectric substrate 11 and the peeling from the base plate 50 of the ceramic dielectric substrate 11 can be suppressed.

The elastic modulus $\gamma2$ of the bonding layer 60 at $25°$ C. is, for example, not less than 0.2 MPa and not more than 1.0 MPa, and favorably not less than 0.2 MPa and not more than 0.4 MPa.

If the elastic modulus $\gamma2$ is 0.2 MPa or more, the bonding layer 60 has sufficient restorability in a room-temperature environment; therefore, the warp of the ceramic dielectric substrate 11 is suppressed easily even when stress is generated between the ceramic dielectric substrate 11 and the base plate 50. The degradation of the in-plane temperature uniformity of the object W in a room-temperature environment can be suppressed thereby.

If the elastic modulus $\gamma2$ is 1.0 MPa or less, the bonding layer 60 in a room-temperature environment can be prevented from being too hard. The stress that is applied to the ceramic dielectric substrate 11 in a room-temperature environment can be suppressed thereby; and the breakage of the ceramic dielectric substrate 11 and the peeling from the base plate 50 of the ceramic dielectric substrate 11 can be suppressed.

The ratio $\gamma1/\gamma2$ of the elastic modulus $\gamma1$ to the elastic modulus $\gamma2$ is, for example, not less than 0.6 and not more than 30, favorably not less than 0.6 and not more than 10, and more favorably not less than 0.6 and not more than 3. The ratio $\gamma1/\gamma2$ is favorably 0.8 or more, and more favorably 0.9 or more. The ratio $\gamma1/\gamma2$ is favorably 2.1 or less.

If the ratio $\gamma1/\gamma2$ of the elastic modulus $\gamma$ is 0.6 or more, sufficient restorability of the bonding layer 60 is maintained even at room temperature and even in a cryogenic environment; therefore, the warp of the ceramic dielectric substrate 11 is suppressed easily even when stress is generated between the ceramic dielectric substrate 11 and the base plate 50. The degradation of the in-plane temperature uniformity of the object W in environments from room temperature to cryogenic can be suppressed thereby.

If the ratio $\gamma1/\gamma2$ of the elastic modulus $\gamma$ is 30 or less, the bonding layer 60 can be prevented from being too hard even at room temperature and even in a cryogenic environment. The stress that is applied to the ceramic dielectric substrate 11 in environments from room temperature to cryogenic can be suppressed thereby; and the breakage of the ceramic dielectric substrate 11 and the peeling from the base plate 50 of the ceramic dielectric substrate 11 can be suppressed.

As recited above, it is favorable for the ceramic dielectric substrate 11 to be thin to shorten the distance between the upper electrode 510 and the base plate 50 connected to the high frequency power supply 504 and from the perspective of the uniformity of the heat. On the other hand, when the ceramic dielectric substrate 11 is thin, there is a risk that the ceramic dielectric substrate 11 may break or fracture if the flexibility of the bonding layer 60 is lost in a cryogenic environment. Conversely, according to the embodiment, the bonding layer 60 has sufficient flexibility in a cryogenic environment; therefore, discrepancies such as fracturing, etc., can be suppressed effectively even when the ceramic dielectric substrate 11 is thin and is 5 mm or less.

Figure 2B:
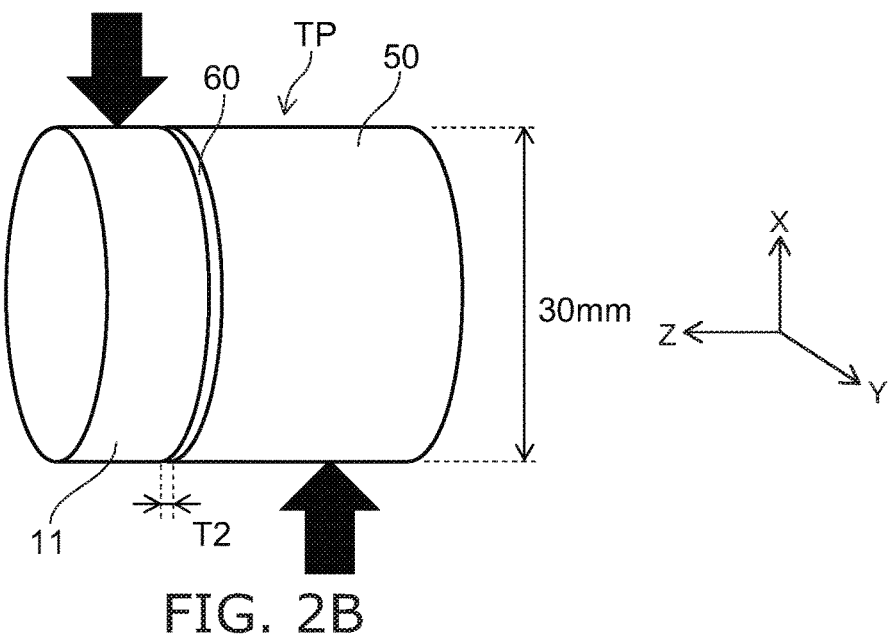
Figure 2C:
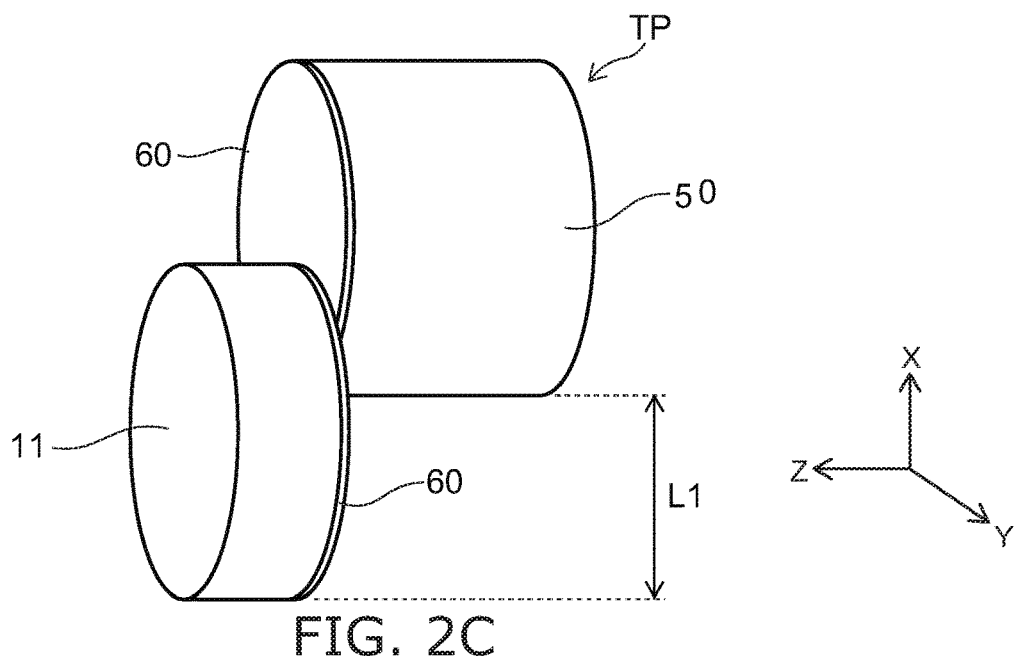

FIG. 2A to FIG. 2C are descriptive views illustrating a method for measuring the elongation percentage and the bonding strength of the bonding layer.

Figure 3:
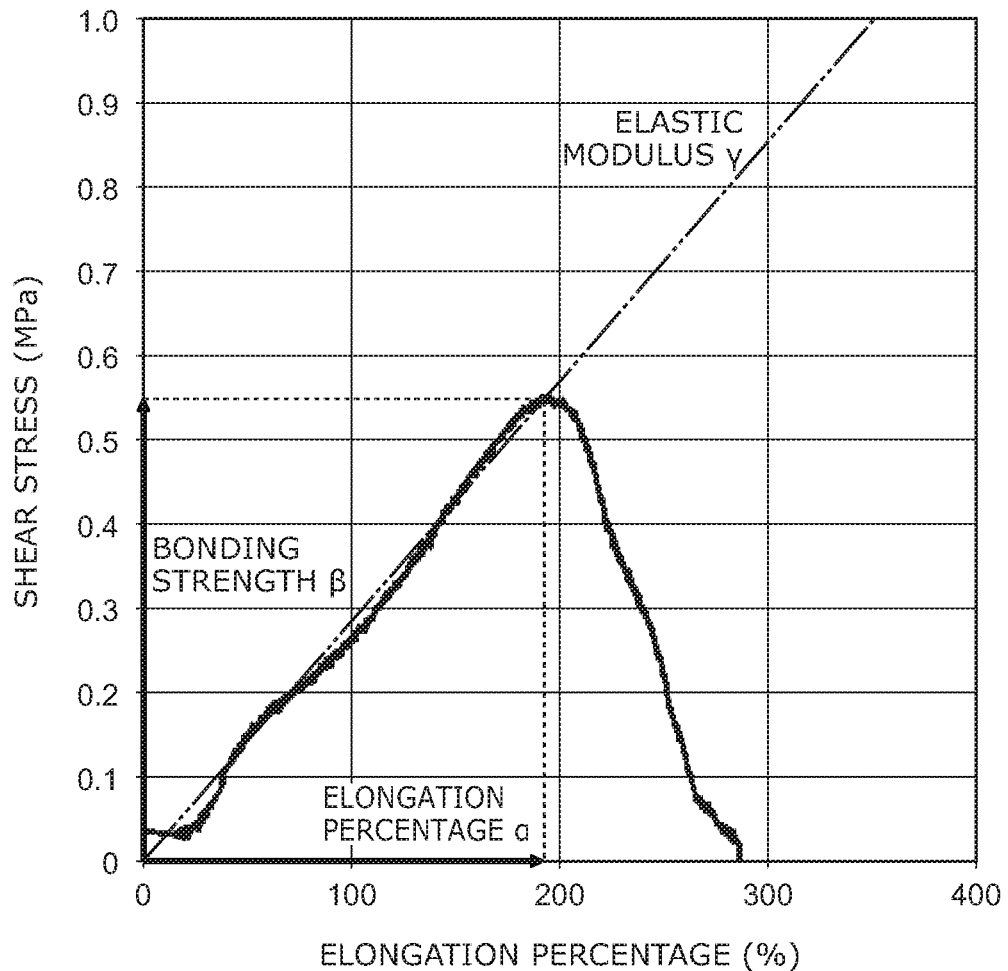
FIG. 3 is a descriptive view illustrating the method for calculating the elastic modulus of the bonding layer.

FIG. 3 is a descriptive view illustrating the method for calculating the elastic modulus of the bonding layer.

Figure 4:
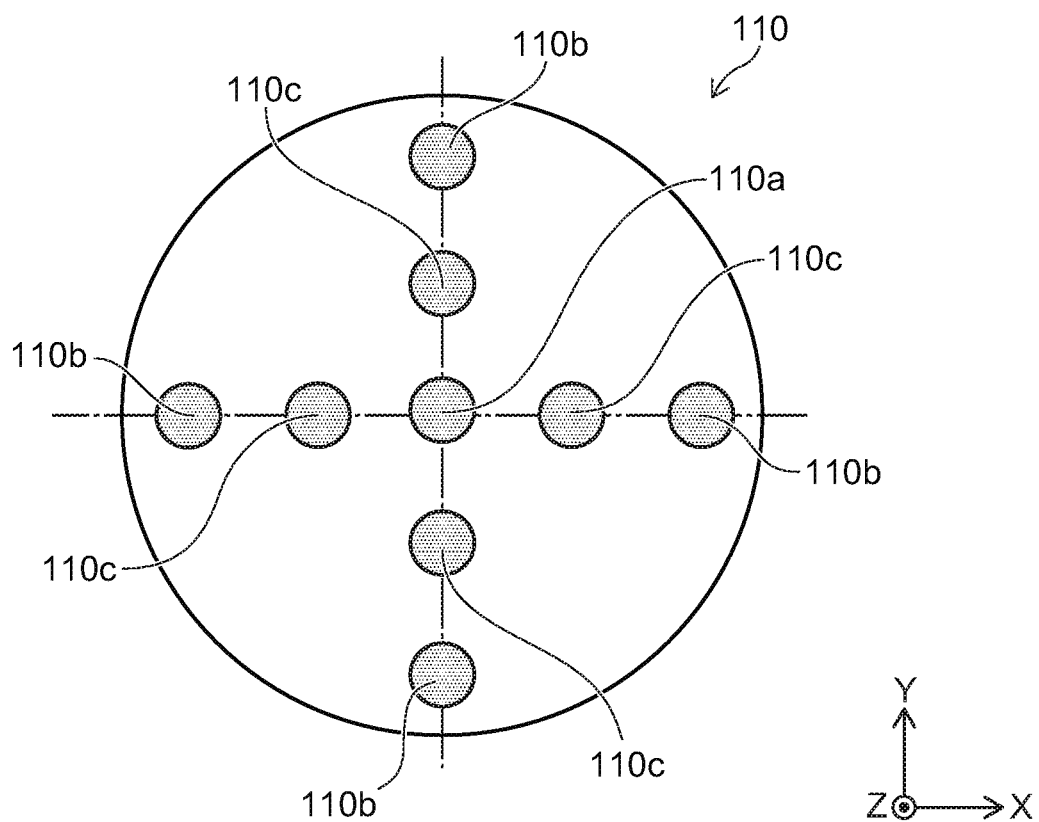
FIG. 4 is a descriptive view illustrating the measurement locations of the elongation percentage and the bonding strength of the bonding layer.

FIG. 4 is a descriptive view illustrating the measurement locations of the elongation percentage and the bonding strength of the bonding layer.

In the embodiment, the elongation percentage $\alpha$ and the bonding strength $\beta$ of the bonding layer 60 can be measured by the method shown in FIG. 2A to FIG. 2C.

When measuring the elongation percentage $\alpha$ and the bonding strength $\beta$ of the bonding layer 60, first, a test piece TP is sampled from the electrostatic chuck 110 as illustrated in FIG. 2A. The test piece TP is sampled so that the electrostatic chuck 110 is pierced in the Z-axis direction. That is, the test piece TP is sampled to include the base plate 50, the bonding layer 60, and the ceramic dielectric substrate 11 stacked in the Z-axis direction. The test piece TP that is sampled is a circular column having a diameter of 30 mm. The sampling method is, for example, helical machining, waterjet cutting, etc.

Then, as illustrated in FIG. 2B, pressures that have opposing orientations along the X-Y plane are applied respectively to the ceramic dielectric substrate 11 and the base plate 50 of the test piece TP. In the example, pressure is applied to the ceramic dielectric substrate 11 in the negative orientation of the X-axis direction; and pressure is applied to the base plate 50 in the positive orientation of the X-axis direction. For example, the pressure is applied by an Autograph. The pressure that is applied to the test piece TP is increased while measuring the elongation percentage $\alpha$ and the shear stress of the bonding layer 60; and the bonding layer 60 fractures as illustrated in FIG. 2C.

For example, the relationship of the elongation percentage $\alpha$ and the shear stress measured by the method recited above is illustrated by the curve shown in FIG. 3. As illustrated in FIG. 3, the shear stress increases until the bonding layer 60 fractures and decreases when the bonding layer 60 fractures. In other words, the point in time when the shear stress is a maximum can be considered to be the point in time when the bonding layer 60 fractures.

The elongation percentage α is represented by 100× (elongation L1 of the bonding layer 60 when fracturing)/(thickness T2 of the bonding layer 60). The elongation L1 of the bonding layer 60 when fracturing is the change amount of the length of the bonding layer 60 in the pressing direction (in the example, the X-axis direction) at the point in time when fracturing. The thickness T2 of the bonding layer 60 is the length of the bonding layer 60 in the Z-axis direction. The bonding strength β is the magnitude of the shear stress when the bonding layer 60 fractures. In other words, the bonding strength β can be determined from the magnitude of the shear stress when the bonding layer 60 fractures.

For example, the Autograph (AGS-X made by Shimadzu Corporation (5 kN)) can be used to measure the elongation percentage α and the bonding strength β. The measurement conditions are, for example, compression rate: 0.1 to 10 mm/min; used load cell: 5 kN; and measurement temperature: 25° C. and −60° C.

As illustrated in FIG. 3, the elastic modulus γ of the bonding layer 60 is represented as the slope of the curve until the bonding layer 60 fractures. In other words, the elastic modulus γ is calculated from the elongation percentage α and the bonding strength β. Specifically, the elastic modulus γ is represented as (bonding strength β of the bonding layer 60 when fracturing)/(strain of the bonding layer 60 when fracturing ((elongation L1 of the bonding layer 60 when fracturing)/(thickness T2 of the bonding layer 60))).

In the embodiment, it is sufficient for the bonding layer 60 to have the elongation percentage α (the elongation percentage ratio), the bonding strength β (the bonding strength ratio), or the elastic modulus γ (the elastic modulus ratio) such as those recited above for the test piece TP sampled from at least one location of the electrostatic chuck 110. It is favorable for the bonding layer 60 to have the elongation percentage α (the elongation percentage ratio), the bonding strength β (the bonding strength ratio), or the elastic modulus γ (the elastic modulus ratio) such as those recited above for each of the test pieces TP sampled from multiple locations of the electrostatic chuck 110. It is also favorable for the average values of the elongation percentage α (the elongation percentage ratio), the bonding strength β (the bonding strength ratio), or the elastic modulus γ (the elastic modulus ratio) of the test pieces TP sampled from the multiple locations of the electrostatic chuck 110 to satisfy the elongation percentage α (the elongation percentage ratio), the bonding strength β (the bonding strength ratio), or the elastic modulus γ (the elastic modulus ratio) recited above.

When the test pieces TP are sampled from the multiple locations of the electrostatic chuck 110, for example, the test pieces TP are sampled from multiple locations in the X-Y plane of the electrostatic chuck 110 as illustrated in FIG. 4; and the elongation percentage α and the bonding strength β of the bonding layer 60 are measured by the method shown in FIG. 2B and FIG. 2C for each of the test pieces TP. The example shows the case where the test pieces TP are sampled from a total of nine locations in the X-Y plane of the electrostatic chuck 110, i.e., a central portion 110a, four locations at outer perimeter portions 110b, and four locations at intermediate portions 110c between the central portion 110a and the outer perimeter portions 110b.

For example, it is sufficient for the bonding layer 60 to have the elongation percentage α (the elongation percentage ratio), the bonding strength β (the bonding strength ratio), or the elastic modulus γ (the elastic modulus ratio) such as those recited above for at least one of the test pieces TP sampled from the nine locations recited above.

Figure 5:
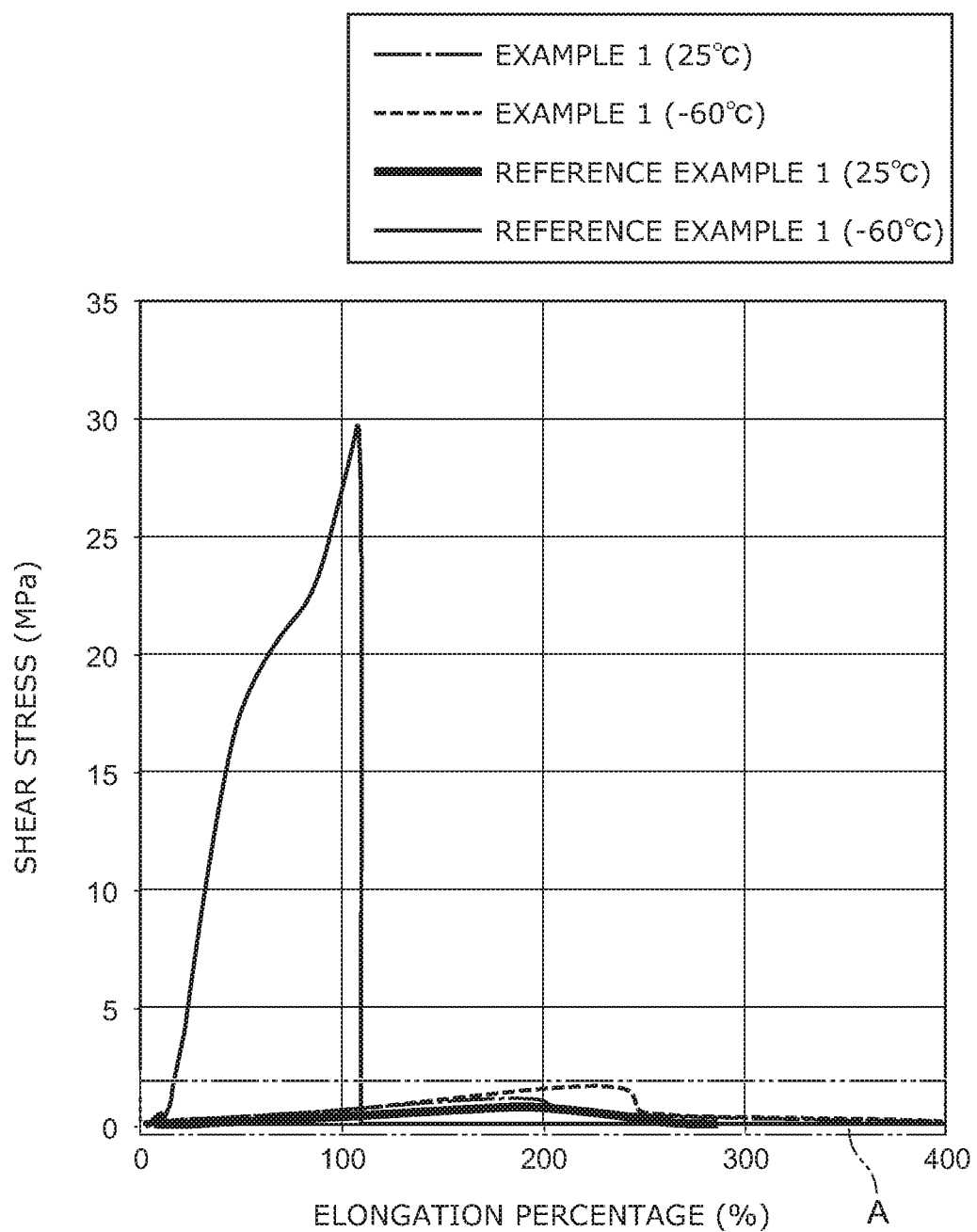
FIG. 5 is a graph illustrating properties of an example of the bonding layer of the electrostatic chuck according to the embodiment.
Figure 6:
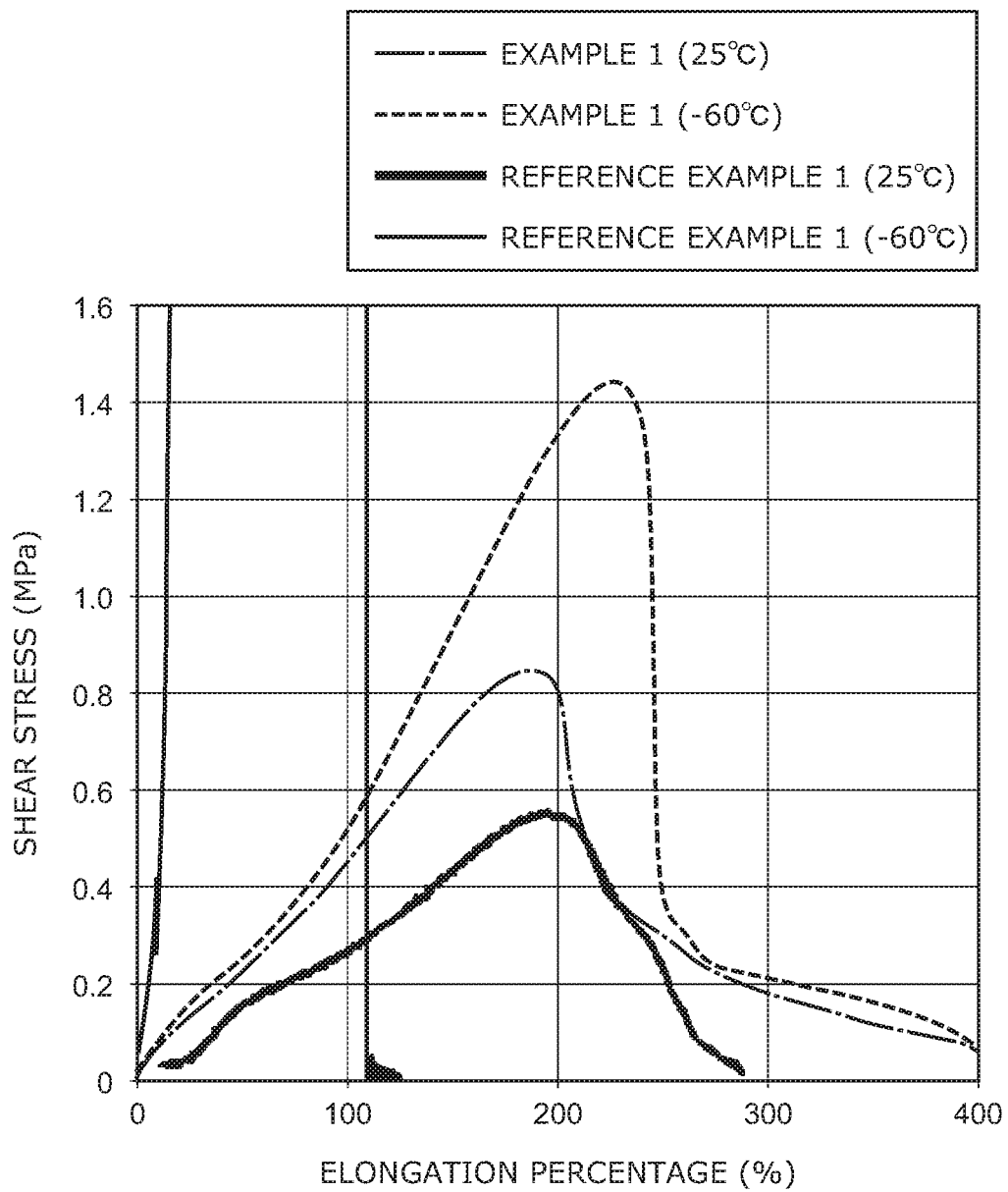
FIG. 6 is a graph illustrating properties of an example of the bonding layer of the electrostatic chuck according to the embodiment.

FIG. 5 and FIG. 6 are graphs illustrating properties of an example of the bonding layer of the electrostatic chuck according to the embodiment.

FIG. 6 is a graph in which portion A of FIG. 5 is enlarged.

FIG. 7 is a table illustrating the properties of the example of the bonding layer of the electrostatic chuck according to the embodiment.

An example 1 is an example of the electrostatic chuck 110 according to the embodiment. A reference example 1 is an example of the electrostatic chuck including the bonding layer 60 having different properties than that of the example 1.

FIG. 5 to FIG. 7 show the elongation percentage α, the bonding strength β, and the elastic modulus γ of the bonding layers 60 of the example 1 and the reference example 1 measured/calculated by the measurement/calculation methods shown in FIG. 2A to FIG. 2C and FIG. 3.

The results of the peeling/breakage test of the example 1 and the reference example 1 also are shown in FIG. 7. In the peeling/breakage test, samples in which the ceramic dielectric substrate 11 and the base plate 50 were bonded by the bonding layer 60 were made; the samples were exposed to −60° C. for at least 3000 hours and subsequently returned to room temperature; and the existence or absence of peeling from the base plate 50 of the ceramic dielectric substrate 11 and the existence or absence of breakage of the ceramic dielectric substrate 11 were evaluated. For the existence or absence of peeling of the bonding layer 60, direct observation was performed in which the existence or absence of cracks, etc., was evaluated by observing the cross section of the bonding layer 60 with a microscope, and an ultrasonic flaw detection was performed in which the existence or absence of cracks, etc., inside the bonding layer 60 was evaluated by applying an ultrasonic wave. The appearance of cracks in at least one of the direct observation or the ultrasonic flaw detection was evaluated as "YES" for peeling; and no cracks appearing in either the direct observation or the ultrasonic flaw detection was evaluated as "NO" for peeling. For the existence or absence of breakage of the ceramic dielectric substrate 11, the appearance of breakage when observing the ceramic dielectric substrate 11 with the naked eye was evaluated as "YES" for breakage; and no breakage was evaluated as "NO" for breakage.

In the reference example 1 as illustrated in FIG. 5 to FIG. 7, the elongation percentage α1 is 107%; the elongation percentage α2 is 195%; and the ratio α1/α2 of the elongation percentage α is 0.5. Because the bonding layer 60 has such an elongation percentage α (elongation percentage ratio) in the reference example 1, the breakage of the ceramic dielectric substrate 11 and the peeling from the base plate 50 of the ceramic dielectric substrate 11 do not occur in the room-temperature environment (25° C.); but in the cryogenic environment (−60° C.), the breakage of the ceramic dielectric substrate 11 and the peeling from the base plate 50 of the ceramic dielectric substrate 11 occur.

Conversely, in the example 1, the elongation percentage α1 is 225%; the elongation percentage α2 is 190%; and the ratio α1/α2 of the elongation percentage α is 1.2. Because the bonding layer 60 has such an elongation percentage α (elongation percentage ratio) in the example 1, the breakage of the ceramic dielectric substrate 11 and the peeling from the base plate 50 of the ceramic dielectric substrate 11 do not occur in either the room-temperature environment (25° C.) or the cryogenic environment (−60° C.).

Thus, by setting the elongation percentage α1 of the bonding layer 60 to be not less than 120% or the ratio α1/α2 of the elongation percentage α to be 0.60 or more, the breakage of the ceramic dielectric substrate 11 and the peeling from the base plate 50 of the ceramic dielectric substrate 11 in a cryogenic environment can be suppressed.

In the reference example 1 as illustrated in FIG. 5 to FIG. 7, the bonding strength β1 is 29.8 MPa; the bonding strength β2 is 0.56 MPa; and the ratio β1/β2 of the bonding strength β is 53.2. Because the bonding layer 60 has such a bonding strength β (bonding strength ratio) in the reference example 1, the breakage of the ceramic dielectric substrate 11 and the peeling from the base plate 50 of the ceramic dielectric substrate 11 do not occur in the room-temperature environment (25° C.); but in the cryogenic environment (−60° C.), the breakage of the ceramic dielectric substrate 11 and the peeling from the base plate 50 of the ceramic dielectric substrate 11 occur.

Conversely, in the example 1, the bonding strength β1 is 1.42 MPa; the bonding strength β2 is 0.83 MPa; and the ratio β1/β2 of the bonding strength β is 1.7. Because the bonding layer 60 has such a bonding strength β (bonding strength ratio) in the example 1, the breakage of the ceramic dielectric substrate 11 and the peeling from the base plate 50 of the ceramic dielectric substrate 11 do not occur in either the room-temperature environment (25° C.) or the cryogenic environment (−60° C.).

Thus, by setting the bonding strength β1 of the bonding layer 60 to be not less than 0.4 MPa and not more than 10 MPa, the breakage of the ceramic dielectric substrate 11 and the peeling from the base plate 50 of the ceramic dielectric substrate 11 in a cryogenic environment can be suppressed.

In the reference example 1 as illustrated in FIG. 5 to FIG. 7, the elastic modulus γ1 is 28 MPa; the elastic modulus γ2 is 0.29 MPa; and the ratio γ1/γ2 of the elastic modulus γ is 96.6. Because the bonding layer 60 has such an elastic modulus γ (elastic modulus ratio) in the reference example 1, the breakage of the ceramic dielectric substrate 11 and the peeling from the base plate 50 of the ceramic dielectric substrate 11 do not occur in the room-temperature environment (25° C.); but in the cryogenic environment (−60° C.), the breakage of the ceramic dielectric substrate 11 and the peeling from the base plate 50 of the ceramic dielectric substrate 11 occur.

Conversely, in the example 1, the elastic modulus γ1 is 0.63 MPa; the elastic modulus γ2 is 0.44 MPa; and the ratio γ1/γ2 of the elastic modulus γ is 1.4. Because the bonding layer 60 has such an elastic modulus γ (elastic modulus ratio) in the example 1, the breakage of the ceramic dielectric substrate 11 and the peeling from the base plate 50 of the ceramic dielectric substrate 11 do not occur in either the room-temperature environment (25° C.) or the cryogenic environment (−60° C.).

Thus, by setting the elastic modulus γ1 of the bonding layer 60 to be not less than 0.1 MPa and not more than 10 MPa or the ratio γ1/γ2 of the elastic modulus γ to be not less than 0.6 and not more than 30, the breakage of the ceramic dielectric substrate 11 and the peeling from the base plate 50 of the ceramic dielectric substrate 11 in a cryogenic environment can be suppressed.

FIG. 8 is a table illustrating properties of an example of the bonding layer of the electrostatic chuck according to the embodiment.

Examples 2 to 14 are examples of the electrostatic chuck 110 according to the embodiment.

FIG. 8 shows the elongation percentage α, the bonding strength β, and the elastic modulus γ of the bonding layer 60 for the examples 2 to 14 measured/calculated similarly to the example 1 and the reference example 1. FIG. 8 also shows the results of the peeling/breakage test performed similarly to the example 1 and the reference example 1.

In the examples 2 to 14 as illustrated in FIG. 8, the elongation percentage α1 is not less than 175% and not more than 247%; the elongation percentage α2 is not less than 150% and not more than 280%; and the ratio α1/α2 of the elongation percentage α is not less than 0.80 and not more than 1.17. Because the bonding layer 60 has such elongation percentages α (elongation percentage ratios) in the examples 2 to 14, the breakage of the ceramic dielectric substrate 11 and the peeling from the base plate 50 of the ceramic dielectric substrate 11 do not occur in either the room-temperature environment (25° C.) or the cryogenic environment (−60° C.).

Thus, by setting the elongation percentage α1 of the bonding layer 60 to be not less than 120% or the ratio α1/α2 of the elongation percentage α to be 0.60 or more, the breakage of the ceramic dielectric substrate 11 and the peeling from the base plate 50 of the ceramic dielectric substrate 11 in a cryogenic environment can be suppressed.

In the examples 2 to 14 as illustrated in FIG. 8, the bonding strength β1 is not less than 0.70 MPa and not more than 1.90 MPa; the bonding strength β2 is not less than 0.51 MPa and not more than 1.60 MPa; and the ratio β1/β2 of the bonding strength β is not less than 0.8 and not more than 1.9. Because the bonding layer 60 has such bonding strengths β (bonding strength ratios) in the examples 2 to 14, the breakage of the ceramic dielectric substrate 11 and the peeling from the base plate 50 of the ceramic dielectric substrate 11 do not occur in either the room-temperature environment (25° C.) or the cryogenic environment (−60° C.).

Thus, by setting the bonding strength β1 of the bonding layer 60 to be not less than 0.4 MPa and not more than 10 MPa, the breakage of the ceramic dielectric substrate 11 and the peeling from the base plate 50 of the ceramic dielectric substrate 11 in a cryogenic environment can be suppressed.

In the examples 2 to 14 as illustrated in FIG. 8, the elastic modulus γ1 is not less than 0.34 MPa and not more than 1.02 MPa; the elastic modulus γ2 is not less than 0.19 MPa and not more than 0.81 MPa; and the ratio γ1/γ2 of the elastic modulus γ is not less than 0.9 and not more than 2.1. Because the bonding layer 60 has such elastic moduli γ (elastic modulus ratios) in the examples 2 to 14, the breakage of the ceramic dielectric substrate 11 and the peeling from the base plate 50 of the ceramic dielectric substrate 11 do not occur in either the room-temperature environment (25° C.) or the cryogenic environment (−60° C.).

Thus, by setting the elastic modulus γ1 of the bonding layer 60 to be not less than 0.1 MPa and not more than 10 MPa or the ratio γ1/γ2 of the elastic modulus γ to be not less than 0.6 and not more than 30, the breakage of the ceramic dielectric substrate 11 and the peeling from the base plate 50 of the ceramic dielectric substrate 11 in a cryogenic environment can be suppressed.

Figure 9:
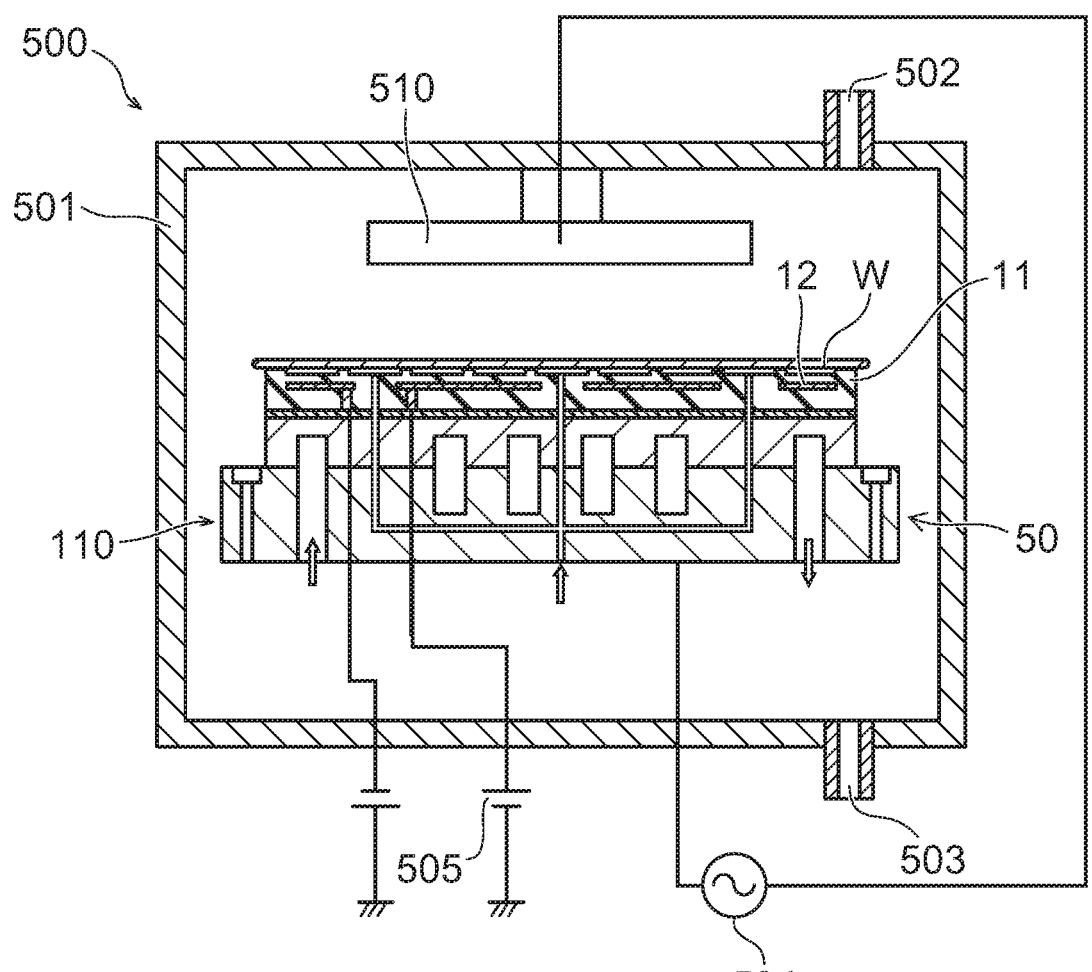
FIG. 9 is a cross-sectional view schematically illustrating a wafer processing apparatus including the electrostatic chuck according to the embodiment.

FIG. 9 is a cross-sectional view schematically illustrating a wafer processing apparatus including the electrostatic chuck according to the embodiment.

As illustrated in FIG. 9, the wafer processing apparatus 500 includes a processing container 501, the high frequency power supply 504, the chucking power supply 505, the upper electrode 510, and the electrostatic chuck 110. The upper electrode 510 and a processing gas inlet 502 for introducing a processing gas to the interior are provided at the ceiling of the processing container 501. An exhaust port 503 for evacuating the interior is provided at the bottom plate of the processing container 501. The electrostatic chuck 110 is disposed under the upper electrode 510 inside the processing container 501. The base plate 50 and the upper electrode 510 of the electrostatic chuck 110 are connected to the high frequency power supply 504. The electrode layer 12 of the electrostatic chuck 110 is connected to the chucking power supply 505.

The base plate 50 and the upper electrode 510 are provided to be substantially parallel and separated from each other by a prescribed spacing. The object W is placed on the first major surface 11a positioned between the base plate 50 and the upper electrode 510.

When a voltage (a high frequency voltage) is applied to the base plate 50 and the upper electrode 510 from the high frequency power supply 504, high frequency electric discharge occurs; the processing gas that is introduced to the processing container 501 is excited by the plasma and activated; and the object W is processed.

When a voltage (a chucking voltage) is applied to the electrode layer 12 from the chucking power supply 505, a charge is generated at the first major surface 11a side of the electrode layer 12; and the object W is held to the electrostatic chuck 110 by an electrostatic force.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, the mounting forms, etc., of the components included in the electrostatic chuck are not limited to those illustrated and can be modified appropriately. The components included in the embodiments described above can be combined within the limits of technical feasibility; and such combinations also are within the scope of the invention to the extent that the features of the invention are included.

What is claimed is:

1. An electrostatic chuck, comprising:
a ceramic dielectric substrate, a thickness of the ceramic dielectric substrate being 5 mm or less;
a base plate supporting the ceramic dielectric substrate, the base plate being made of a metal;
an electrode layer disposed inside of the ceramic dielectric substrate; and
a bonding layer including a resin material and an inorganic filler and being provided between the ceramic dielectric substrate and the base plate, an upper surface of the bonding layer contacting a lower surface of the ceramic dielectric substrate, a lower surface of the bonding layer contacting an upper surface of the base plate,
wherein the resin material includes a silicone having a phenyl group, the phenyl group bonding to a siloxane skeleton of the silicone,
wherein the electrostatic chuck is configured to be used in cryogenic conditions at −60° C. or less,
and wherein the bonding layer is configured so that at least one of the following first to sixth conditions is satisfied:
First condition: An elongation percentage $\alpha 1$ of the bonding layer at −60° C. is not less than 120%;
Second condition: A ratio $\alpha 1/\alpha 2$ of the elongation percentage $\alpha 1$ to an elongation percentage $\alpha 2$ of the bonding layer at 25° C. is not less than 0.60;
Third condition: A bonding strength $\beta 1$ of the bonding layer at −60° C. is not less than 0.4 MPa and not more than 10 MPa;
Fourth condition: A ratio $\beta 1/\beta 2$ of the bonding strength $\beta 1$ to a bonding strength $\beta 2$ of the bonding layer at 25° C. is not less than 0.6 and not more than 10;
Fifth condition: An elastic modulus $\gamma 1$ of the bonding layer at −60° C. is not less than 0.1 MPa and not more than 10 MPa;
Sixth condition: A ratio $\gamma 1/\gamma 2$ of the elastic modulus $\gamma 1$ to an elastic modulus $\gamma 2$ of the bonding layer at 25° C. is not less than 0.6 and not more than 30,
said first to sixth conditions being effective to prevent the bonding layer from peeling even after the electrostatic chuck is exposed to −60° C. for 3000 hours and subsequently returned to room temperature,
whereby breakage of the ceramic dielectric substrate and the peeling from the base plate of the ceramic dielectric substrate can be suppressed when the electrostatic chuck is used in a cryogenic environment of −60° C. or less.

2. The chuck according to claim 1, wherein the elongation percentage $\alpha 1$ is 175% or more.

3. The chuck according to claim 2, wherein the elongation percentage $\alpha 1$ is 200% or more.

4. The chuck according to claim 1, wherein the ratio $\alpha 1/\alpha 2$ is 0.80 or more.

5. The chuck according to claim 1, wherein the bonding strength $\beta 1$ is not less than 0.4 MPa and not more than 2.0 MPa.

6. The chuck according to claim 1, wherein the ratio $\beta 1/\beta 2$ is 0.8 or more.

7. The chuck according to claim 1, wherein the elastic modulus $\gamma 1$ is 0.3 MPa or more.

8. The chuck according to claim 1, wherein the ratio $\gamma 1/\gamma 2$ is 0.8 or more.

9. The chuck according to claim 1, wherein the ceramic dielectric substrate includes at least one of aluminum oxide, aluminum nitride, silicon carbide, silicon nitride, or yttrium oxide.

10. The chuck according to claim 9, wherein the ceramic dielectric substrate includes aluminum oxide.

11. An electrostatic chuck, comprising:
a ceramic dielectric substrate, a thickness of the ceramic dielectric substrate being 5 mm or less;
a base plate supporting the ceramic dielectric substrate, the base plate being made of a metal;
an electrode layer disposed inside of the ceramic dielectric substrate; and
a bonding layer including a resin material and an inorganic filler and being provided between the ceramic dielectric substrate and the base plate, an upper surface of the bonding layer contacting a lower surface of the ceramic dielectric substrate, a lower surface of the bonding layer contacting an upper surface of the base plate,
wherein the resin material includes a silicone having a phenyl group, the phenyl group bonding to a siloxane skeleton of the silicone,
wherein the electrostatic chuck is configured to be used in cryogenic conditions at −60° C. or less,
and wherein the bonding layer is configured so that it satisfies the following conditions:

an elongation percentage α1 of the bonding layer at −60° C. is not less than 120%;

a ratio α1/α2 of the elongation percentage α1 to an elongation percentage α2 of the bonding layer at 25° C. is not less than 0.60;

an elastic modulus γ1 of the bonding layer at −60° C. is not less than 0.1 MPa and not more than 10 MPa; and a ratio γ1/γ2 of the elastic modulus γ1 to an elastic modulus γ2 of the bonding layer at 25° C. is not less than 0.6 and not more than 30, said conditions of the bonding layer being effective to prevent the bonding layer from peeling even after the electrostatic chuck is exposed to −60° C. for 3000 hours and subsequently returned to room temperature, whereby the electrostatic chuck can be used in a cryogenic environment of −60° C. or less while maintaining appropriate flexibility between the ceramic dielectric substrate and the metal base plate and so that breakage of the ceramic dielectric substrate and the peeling from the base plate of the ceramic dielectric substrate can be suppressed.

12. The chuck according to claim 11, wherein the elongation percentage 1 is 175% or more.

13. The chuck according to claim 11, wherein the elongation percentage α1 is 200% or more.

14. The chuck according to claim 11, wherein the ratio α1/α2 is 0.80 or more.

15. The chuck according to claim 11, wherein the elastic modulus γ1 is 0.3 MPa or more.

16. The chuck according to claim 11, wherein the ratio γ1/γ2 is 0.8 or more.

17. The chuck according to claim 11, wherein a bonding strength β1 of the bonding layer at −60° C. is not less than 0.4 MPa and not more than 10 MPa.

18. The chuck according to claim 17, wherein a ratio β1/β2 of the bonding strength β1 to a bonding strength β2 of the bonding layer at 25° C. is not less than 0.6 and not more than 10.

19. The chuck according to claim 17, wherein the bonding strength β1 is not less than 0.4 MPa and not more than 2.0 MPa.

20. The chuck according to claim 18, wherein the ratio β1/β2 is 0.8 or more.

* * * * *